United States Patent [19]

Bläsing et al.

[11] Patent Number: 4,789,405
[45] Date of Patent: Dec. 6, 1988

[54] METHOD OF AND ARRANGEMENT FOR CLEANING, ACTIVATING AND METALLIZING OF BORE HOLES IN CONDUCTOR BOARDS

[75] Inventors: Horst Bläsing; Walter Meyer, both of Berlin, Fed. Rep. of Germany

[73] Assignee: Schering Aktiengesellschaft, Berlin and Bergkamen, Fed. Rep. of Germany

[21] Appl. No.: 893,563

[22] Filed: Aug. 4, 1986

[30] Foreign Application Priority Data

Aug. 6, 1985 [DE] Fed. Rep. of Germany ....... 3528575

[51] Int. Cl.⁴ .............................................. B08B 3/12
[52] U.S. Cl. ...................................... 134/1; 134/25.4; 134/25.1; 134/87; 134/89; 239/DIG. 19; 239/DIG. 22
[58] Field of Search ................... 134/1, 25.1, 25.4, 89, 134/87; 239/DIG. 19, DIG. 22

[56] References Cited

U.S. PATENT DOCUMENTS

| | | | |
|---|---|---|---|
| 4,131,483 | 12/1978 | Iwahashi et al. | 134/1 |
| 4,132,567 | 1/1979 | Blackwood | 134/1 |
| 4,543,130 | 9/1985 | Shwartzman | 134/1 |
| 4,589,926 | 5/1986 | Holmstrand | 134/25.4 |

OTHER PUBLICATIONS

English Abstract of German Pat. No. 2,606,984, 8/25/77.

*Primary Examiner*—H. M. S. Sneed
*Assistant Examiner*—Sharon T. Cohen
*Attorney, Agent, or Firm*—Michael J. Striker

[57] ABSTRACT

Cleaning, activating and metallizing of bore holes in conductor boards is performed by supplying a liquid treatment medium in form a standing wave onto a lower side of the conductor board by a surge line which is formed as a nozzle arranged under a transporting path and substantially normal to a transporting direction of the horizontally guided conductor board.

22 Claims, 4 Drawing Sheets

METHOD OF AND ARRANGEMENT FOR CLEANING, ACTIVATING AND METALLIZING OF BORE HOLES IN CONDUCTOR BOARDS

BACKGROUND OF THE INVENTION

The present invention relates to a method of and an arrangement for cleaning, activating and metallizing of bore holes in conductor boards, and more particularly in horizontally guided conductor boards.

Conductor boards for printed circuit are known in which the bore holes are connected with both outer surfaces or inside the isolating surfaces with one another, after the activation and metallization with so-called through-contacting process. The operational properties of such conductor boards are dependent, to a great extent, upon exact removal of respective impurities. Methods and arrangements for cleaning of such contacting holes in conductor boards are known, for example from German Pat. No. 2,606,984. These methods and arrangements have long treatment times because their relatively low flow rates, and therefore they can be improved.

SUMMARY OF THE INVENTION

Accordingly, it is an object of the present invention to provide a method of and an arrangement for cleaning, activating and metallizing of bores holes in conductor boards, in which an exact cleaning and treatment of bore holes in conductor boards is possible with high flow rates and in short treatment times.

In keeping with these objects and with others which will become apparent hereinafter, one feature of the present invention resides, briefly stated, in a method in accordance with which a conductor board is displaced over a surge line which is formed by a nozzle arranged under a transporting path and normal to the transporting direction, and a liquid treatment medium is supplied from the nozzle in form of a standing wave to the lower side of the conductor board.

When the method is performed in accordance with the present invention, a perfect cleaning of inner walls of the holes in the conductor boards is performed in extraordinarily short treatment times which have never been reached before. The method is also suitable for activation and metallization of bore holes with the use of conventional activation and metallization solutions.

It is especially advantageous that the bore holes with smallest diameters up to 0.15 mm can be reliably conditioned, activated and/or metallized.

A further advantage is that the metallization, for example chemical copper-plating, can be considerably improved because of the absence of adhering hydrogen bubbles. The majority of the process steps can be performed without heating, and a support demetallization is dispensed with.

In accordance with an advantageous feature of the present invention the nozzle can be formed as a plain perforation member provided with slots, holes or broken through, symmetrically or asymmetrically.

Water, acids such as sulphur acid bases can be used for example as a liquid treatment medium. Conventional activation solutions can be used for activation, for example, based on noble metal solutions, such as palladium salt solution. Also, conventional bath can be used for chemical and in some cases galvanic metallization.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF A PREFERRED EMBODIMENT

Figure 1:
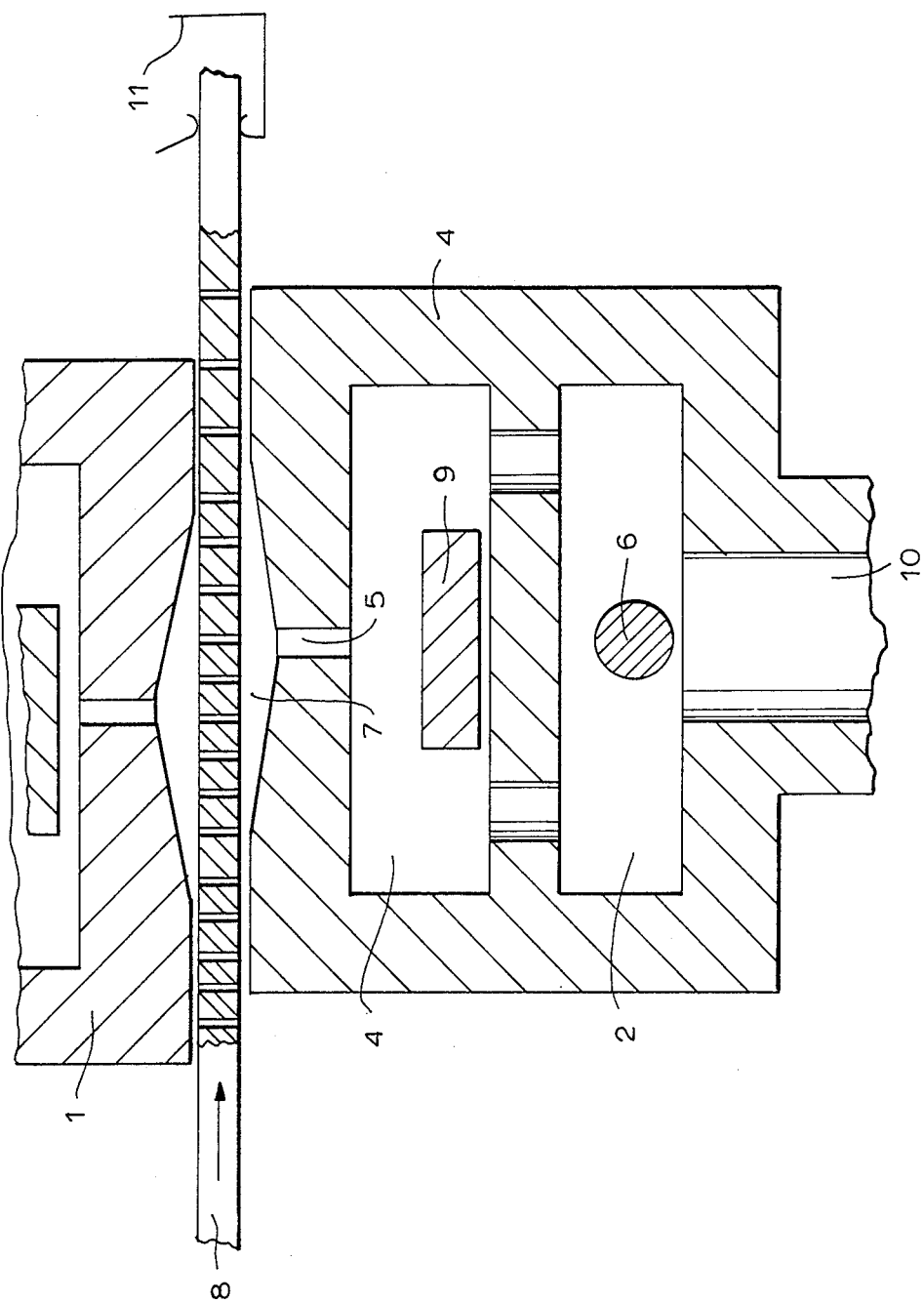
FIG. 1 is a view showing a cross-section of an arrangement for cleaning, activating and metallizing of conductor boards in accordance with the present invention.

An arrangement for cleaning, activating and metallizing of bore holes in conductor boards is shown in section in FIG. 1 and includes a surge line formed as a nozzle. 5 A conductor board is moved along a transporting path in a transporting direction identified with the arrow in FIG. 1. One of the above mentioned nozzles is located under the transporting path and normal to the transporting direction of the conductor board.

The nozzle includes a nozzle housing which is identified as a whole with reference numeral 1. A pre-chamber 2 is formed in the nozzle housing 1. The nozzle housing 1 also defines an inner chamber 4 and is provided with a hole mask 3. An outlet opening 5 is provided in the nozzle housing 1.

Reference numeral 6 identifies an anode. As can be seen from the drawing, the upper surface is provided with an indentation which forms a space between the nozzle housing 1 and the conductor plate 8. An ultrasonic vibrator 9 is accommodated in the inner chamber 4. Finally, an inlet pipe 10 is connected with the pre-chamber 2 of the nozzle housing 1.

Figure 3:
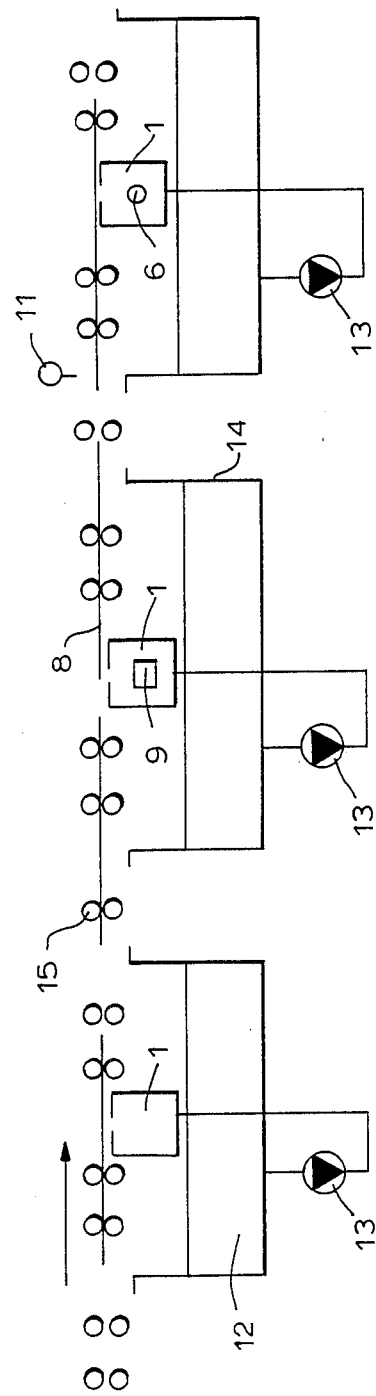
FIG. 3 is a view schematically showing the steps of the method of cleaning, activating and metallizing of bore holes in conductor boards in accordance with the present invention.
Figures 4, 5:
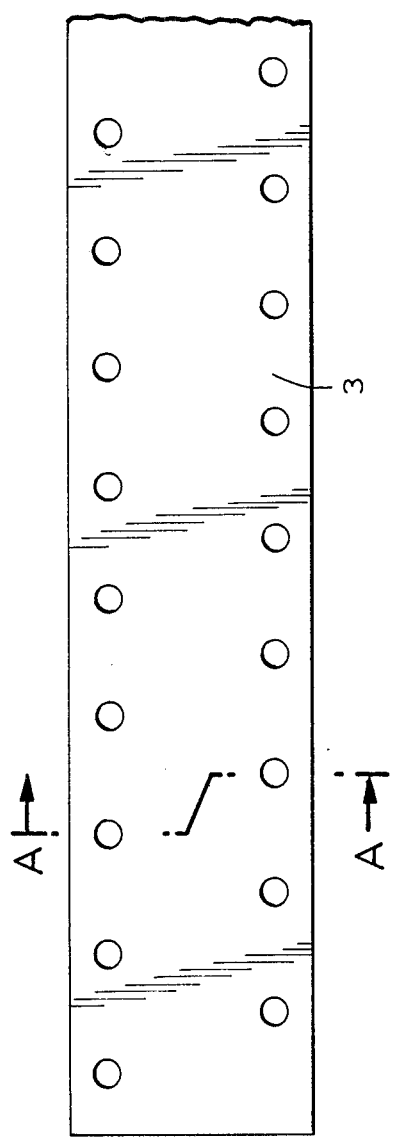
FIG. 4 is a plan view and a side view of a hole mask and FIG. 5 is a cross-section of the hole mask.

As can be seen from FIG. 3, a treatment solution 12 is accommodated in a container 14. The treatment plate 8 is guided by guiding rollers 15 and is contacted by sliding contacts 11.

Coming back to FIG. 1, it can be seen that another nozzle can be arranged above the transporting path of the conductor board 8 and also normal to the transporting direction. The construction of the upper nozzle can be identical to the construction of the lower nozzle. The upper and lower nozzles can be arranged in vertical alignment with one another or offset relative to one another.

Figure 2:
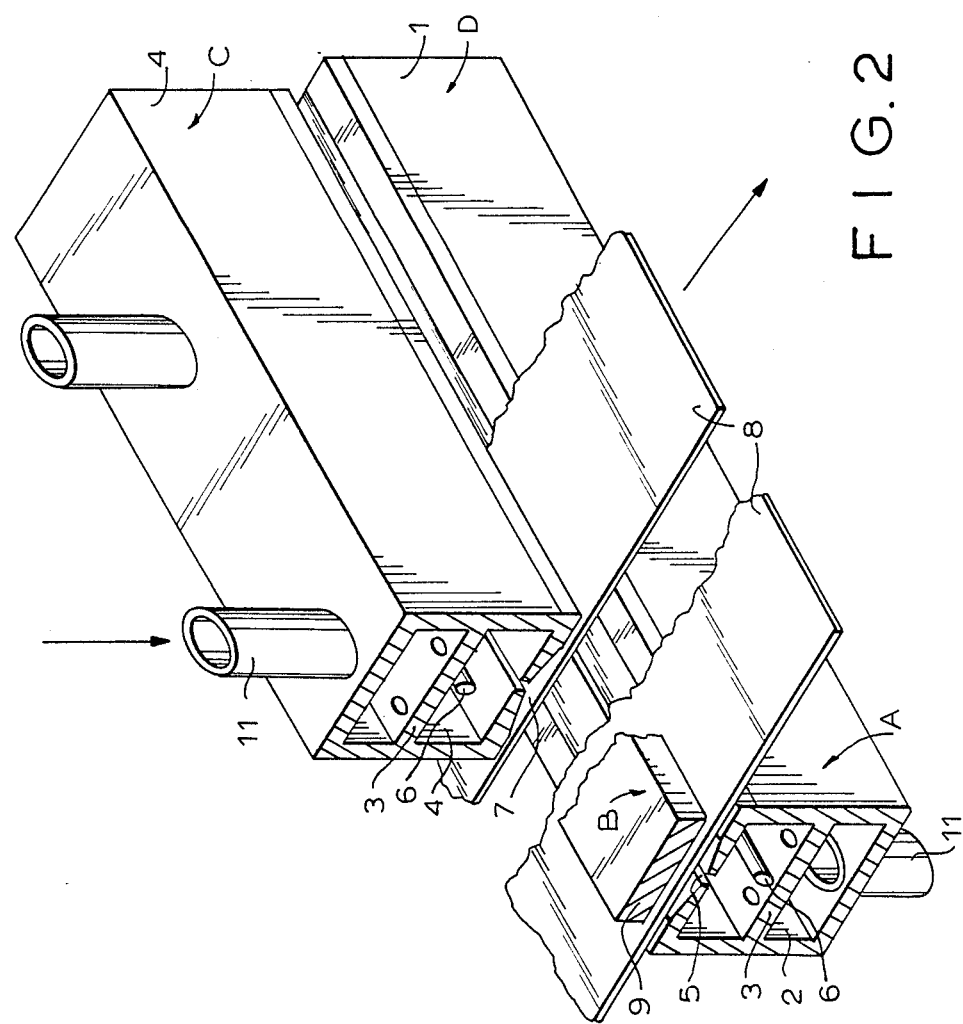
FIG. 2 is a perspective view of the arrangement of FIG. 1.

FIG. 2 shows several possible combinations of the respective units of the inventive arrangement. Reference A identifies the arrangement which includes one nozzle located under the transporting path of the conductor board. References A and B identify the arrangement which includes the nozzle located under the transporting path of the conductor board and the ultrasonic vibrator B located above the transporting path. References A and C identify the arrangement including two nozzles located under and above the transporting path of the conductor board respectively and arranged in vertical alignment or offset relative to one another.

References A, B and C identify the arrangement including upper and lower nozzles and the ultrasonic vibrator. References A and D identify the arrangement which includes the nozzle located under the transporting path of the conductor board and provided with anode and cathode for electrolysis. Finally, references A, C and D identify the arrangement including the upper and lower nozzles and provided with anode and cathode for electrolysis.

The arrangement in accordance with the present invention operates and the method is performed in the following manner:

Through several inlet pipes 10 the treatment solution, for example water, is supplied into the pre-chamber 2. The inner chamber of the nozzle is subdivided by the hole mask so as to provide distribution of the flow to the nozzle opening. The inner chamber 4 located before the nozzle opening which is formed here as a slot, serves as a dynamic air pressure producing or decelerating chamber for a uniform formation of the surge after passing the nozzle outlet 5. In the space 7 between the nozzle housing 1 and the conductor plate 8, a negative pressure is formed which forces the solution over the region of the high flow through the bore holes. In the event of the chemical treatment, the conductor plate is treated only with the lower surge nozzle. For cleaning processes with ultrasonic and chemical processes, the treatment is performed with two surge nozzles which are located with an offset above and below the conductor plate. In these cases the ultrasonic vibrator 9 is installed above the conductor plate in the respective surge nozzle. For the electrolysis, the anode 6 is accommodated in the inner chamber. The negative polarization of the conductor plate 8 is performed via the sliding contacts 11 which are positioned outside the wet region before and after the nozzles.

The method and arrangement in accordance with the present invention are especially suitable for treatment of conductor plates for printed circuits which are used in electronics.

It will be understood that each of the elements described above, or two or more together, may also find a useful application in other types of constructions differing from the types described above.

While the invention has been illustrated and described as embodied in a method and an arrangement for cleaning, activating and metallizing of bore holes in conductor boards, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A method of cleaning, activating and metallizing of bore holes in conductor boards, comprising the steps of moving a conductor board only horizontally along a transporting path in a transporting direction; and supplying a treatment medium in form of a standing wave onto a lower side of the conductor board through a surge line formed as a nozzle located under the transporting path and substantially normal to the transporting direction of the conductor board.

2. A method as defined in claim 1, wherein said moving step includes moving the conductor board above the surge line with a constant speed.

3. A method as defined in claim 1, wherein said moving step includes moving the conductor board at a distance of substantially 1 mm above the surge line.

4. A method as defined in claim 1; and further comprising the step of supplying a liquid treatment medium in form of a standing wave also onto an upper side of the conductor plate through a surge line formed as a nozzle located above the transporting path and substantially normal to the transporting direction.

5. An arrangement for cleaning, activating and metallizing of bore holes in conductor boards, comprising means for moving a conductor board only horizontally along a transporting path; and a surge line which is formed as a nozzle located under said transporting path and substantially normal to the transporting direction, and which is arranged for supplying a liquid treatment medium in form of a standing wave onto a lower side of the conductor board.

6. An arrangement as defined in claim 5, wherein said moving means is formed so as to move the conductor board with a constant speed over said surge line.

7. An arrangement as defined in claim 5, wherein said nozzle and said transporting means are arranged so that the conductor board is transported over said nozzle at a distance of substantially 1 mm from the latter.

8. An arrangement as defined in claim 5, wherein said nozzle has a hollow nozzle housing, means separating said nozzle housing into a pre-chamber and an upper chamber communicating with one another, and a nozzle outlet extending from said upper chamber outwardly.

9. An arrangement as defined in claim 8, wherein said nozzle housing has an upper part, said nozzle outlet being formed in said upper part of said nozzle housing.

10. An arrangement as defined in claim 8, wherein said separating means is formed as a hole mask provided with a plurality of holes communicating said pre-chamber with said upper chamber.

11. An arrangement as defined in claim 5, wherein said nozzle is formed as a plane perforated manner provided with a plurality of channels.

12. An arrangement as defined in claim 11, wherein said channels in said plane member of said nozzle are formed as slots.

13. An arrangement as defined in claim 11, wherein said channels of said plane member of said nozzle are formed as holes.

14. An arrangement as defined in claim 11, wherein said channels in said plane member of said nozzle are formed as symmetrical passages.

15. An arrangement as defined in claim 11, wherein said channels in said plane member of said nozzle are formed as asymmetrical passages.

16. An arrangement as defined in claim 10, wherein said upper portion of said nozzle housing has an upper surface which lowers downwardly toward said nozzle outlet.

17. An arrangement as defined in claim 5, wherein said nozzle has a nozzle housing; and further comprising an ultrasonic vibrator located in said nozzle housing.

18. An arrangement as defined in claim 17, wherein said nozzle housing of said nozzle has an upper part, said ultrasonic vibrator being arranged in said upper part of said nozzle housing.

19. An arrangement as defined in claim 5; and further comprising a further surge line arranged for supplying a liquid treatment medium in form of a standing wave onto an upper side of the conductor board and formed as a nozzle located above said transporting path and substantially normal to said transporting direction.

20. An arrangement as defined in claim 19, wherein said nozzles of said surge lines are offset relative to one another.

21. An arrangement as defined in claim 5, wherein said nozzle has a nozzle housing; and further comprising an anode arranged in said nozzle housing.

22. An arrangement as defined in claim 21, wherein said nozzle housing of said nozzle has a lower part, said anode being arranged in said lower part of said nozzle housing.

* * * * *